United States Patent
Xu

(10) Patent No.: US 12,078,924 B2
(45) Date of Patent: Sep. 3, 2024

(54) LAYOUT CORRECTION METHOD

(71) Applicant: CHANGXIN MEMORY TECHNOLOGIES, INC., Anhui (CN)

(72) Inventor: Tingting Xu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 392 days.

(21) Appl. No.: 17/530,564

(22) Filed: Nov. 19, 2021

(65) Prior Publication Data

US 2022/0075257 A1  Mar. 10, 2022

Related U.S. Application Data

(63) Continuation of application No. PCT/CN2021/101500, filed on Jun. 22, 2021.

(30) Foreign Application Priority Data

Aug. 21, 2020 (CN) .......................... 202010846878.2

(51) Int. Cl.
  *G06F 30/30*  (2020.01)
  *G03F 1/36*  (2012.01)
  *G03F 1/70*  (2012.01)
  *G03F 7/00*  (2006.01)
  *G06F 30/398*  (2020.01)

(52) U.S. Cl.
  CPC ............... *G03F 1/70* (2013.01); *G03F 1/36* (2013.01); *G03F 7/70441* (2013.01); *G06F 30/398* (2020.01)

(58) Field of Classification Search
  None
  See application file for complete search history.

(56) References Cited

U.S. PATENT DOCUMENTS

| | | |
|---|---|---|
| 8,056,022 B2 | 11/2011 | Robles |
| 8,504,959 B2 | 8/2013 | Torres Robles |
| 8,832,609 B2 | 9/2014 | Robles et al. |
| 10,210,295 B2 | 2/2019 | Rosenbluth |
| 10,394,984 B2 | 8/2019 | Rosenbluth |
| 10,437,950 B2 | 10/2019 | Rosenbluth |
| 10,872,188 B2 | 12/2020 | Rosenbluth |
| 10,915,686 B2 | 2/2021 | Rosenbluth |
| 2008/0141195 A1 | 6/2008 | Torres Robles |
| 2008/0203589 A1* | 8/2008 | Bailey ............... G06F 30/39  438/758 |
| 2011/0029939 A1* | 2/2011 | Yang ............... G06F 30/398  716/55 |
| 2012/0144351 A1 | 6/2012 | Torres Robles |
| 2013/0305195 A1 | 11/2013 | Robles et al. |

(Continued)

FOREIGN PATENT DOCUMENTS

| | | | |
|---|---|---|---|
| CN | 107706103 A * | 2/2018 | ........... H01L 21/308 |
| CN | 108776421 A | 11/2018 | |

(Continued)

*Primary Examiner* — Leigh M Garbowski
(74) *Attorney, Agent, or Firm* — Kilpatrick Townsend & Stockton LLP

(57) ABSTRACT

A layout correction method is provided. The layout correction method includes: providing an initial layout; expanding the initial layout to obtain an expanded layout; correcting the expanded layout to obtain a corrected layout; and obtaining a target layout based on the corrected layout.

11 Claims, 9 Drawing Sheets

(56) References Cited

U.S. PATENT DOCUMENTS

| | | |
|---|---|---|
| 2017/0147733 A1 | 5/2017 | Rosenbluth |
| 2017/0147734 A1 | 5/2017 | Rosenbluth |
| 2017/0270230 A1 | 9/2017 | Rosenbluth |
| 2020/0074031 A1 | 3/2020 | Rosenbluth |
| 2020/0074032 A1 | 3/2020 | Rosenbluth |
| 2021/0096462 A1* | 4/2021 | Ito .................. G03F 7/0002 |

FOREIGN PATENT DOCUMENTS

| | | |
|---|---|---|
| CN | 108828896 A | 11/2018 |
| CN | 109031880 A | 12/2018 |
| CN | 109494185 A | 3/2019 |
| CN | 110119063 A | 8/2019 |
| CN | 112506000 A | 3/2021 |

* cited by examiner

| UL | T | T | ... | T | T | UR |
|----|---|---|-----|---|---|----|
| L | C | C | ... | C | C | R |
| L | C | C | ... | C | C | R |
| ... | ... | ... | ... | ... | ... | ... |
| L | C | C | ... | C | C | R |
| L | C | C | ... | C | C | R |
| LL | B | B | ... | B | B | LR |

FIG. 4

| UL | T | T | ... | T | T | UR |
|----|---|---|-----|---|---|----|
| L | C | C | ... | C | C | R |
| L | C | C | ... | C | C | R |
| ... | ... | ... | ... | ... | ... | ... |
| L | C | C | ... | C | C | R |
| L | C | C | ... | C | C | R |
| LL | B | B | ... | B | B | LR |

FIG. 8

LAYOUT CORRECTION METHOD

CROSS-REFERENCE TO RELATED APPLICATION

This is a continuation application of International Patent Application No. PCT/CN2021/101500, filed on Jun. 22, 2021, which claims priority to Chinese Patent Application 202010846878.2, filed on Aug. 21, 2020 and entitled "Layout Correction Method". The disclosures of International Patent Application No. PCT/CN2021/101500 and Chinese Patent Application 202010846878.2 are hereby incorporated by reference in their entireties.

TECHNICAL FIELD

The present application belongs to the technical field of semiconductors, and in particular to a layout correction method.

BACKGROUND

At present, during correction on a layout of a Dynamic Random Access Memory (DRAM) array, in order to save time, a smaller-size layout area is generally selected for correction, and then the layout area is expanded into a larger array area. The effect of the optical diameter is not considered for the smaller-size layout area, which will lead to inaccurate optical proximity correction. Non-uniform Critical Dimension (CD) or fluctuations in a photoresist profile on a wafer is thus caused, and the product yield is further influenced.

SUMMARY

According to some embodiments, in one aspect of the present application, there is provided a layout correction method, including:
  providing an initial layout;
  expanding the initial layout to obtain an expanded layout;
  correcting the expanded layout to obtain a corrected layout; and
  obtaining a target layout based on the corrected layout.

The details of various embodiments of the present application will be illuminated in the drawings and the description below. Other features, problems to be solved, and beneficial effects of the present application will be readily apparent to those skilled in the art from the description, drawings and claims.

BRIEF DESCRIPTION OF THE DRAWINGS

In order to more clearly illustrate the technical solutions of the embodiments of the present application, the drawings used in the descriptions of the embodiments will be briefly described. Additional details or examples for describing the drawings should not be construed as limiting the scope of any one of the invention, presently described embodiments, or exemplary implementations of the present application.

FIGS. 2-8 illustrate schematic diagrams of layouts which are obtained in each step of the layout correction method provided by an embodiment of the present application.

DETAILED DESCRIPTION

Figure 1:
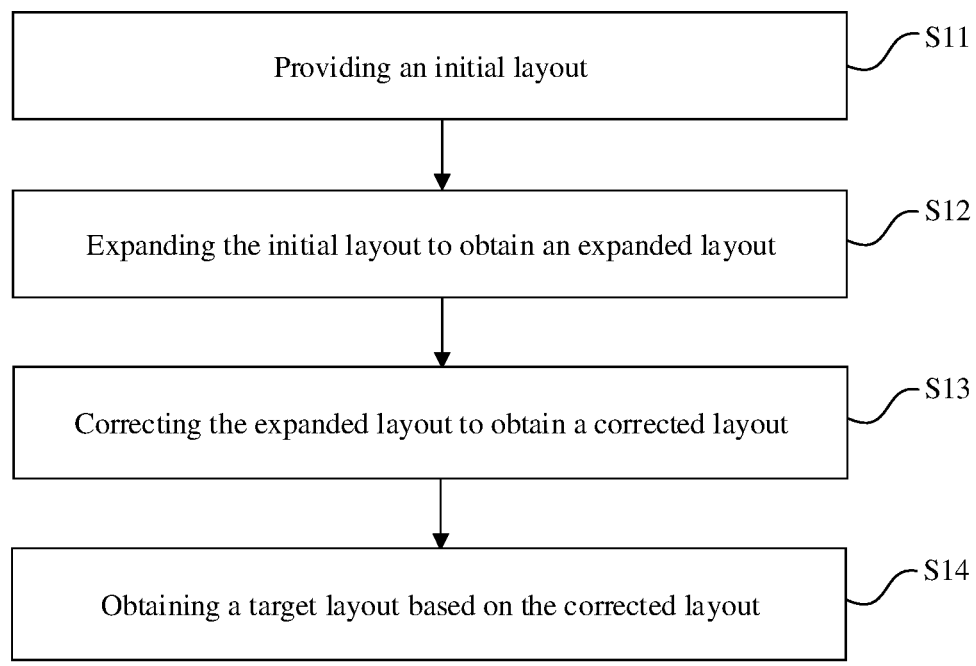
FIG. 1 illustrates a flowchart of a layout correction method provided by an embodiment of the present application.

For convenience of an understanding of the present application, the present application will now be described more fully hereinafter with reference to the related drawings. Exemplary embodiments of the present application are provided in the drawings. The present application may, however, be embodied in many different forms which are not limited to the embodiments described herein. Rather, these embodiments are provided so that the disclosure of the present application will be more thorough and complete.

Unless defined otherwise, all technical and scientific terms used herein have the same meaning as commonly understood by those skilled in the art to which the present application belongs. The terms used herein in the specification of the present application is for the purpose of describing specific embodiments only and is not intended to be limiting of the present application.

Where similar terms such as "comprising", "having" and the like are used as described herein, another component may be added unless expressly limited terms such as "only", "consisting of" and the like are used. Unless mentioned to the contrary, singular terms may include the plural, and are not to be construed in an amount of one.

Referring to FIG. 1, an embodiment of the present application provides a layout correction method. The method includes the following operations.

At S11, an initial layout is provided.

At S12, the initial layout is expanded to obtain an expanded layout.

At S13, the expanded layout is corrected to obtain a corrected layout.

At S14, a target layout is obtained based on the corrected layout.

After the layout is corrected by the layout correction method according to the embodiment, the reliability of Optical Proximity Correction (OPC) is higher, a critical dimension is uniform, and fluctuations in a photoresist profile on a wafer cannot be caused, so that the product yield is ensured.

Figure 2:
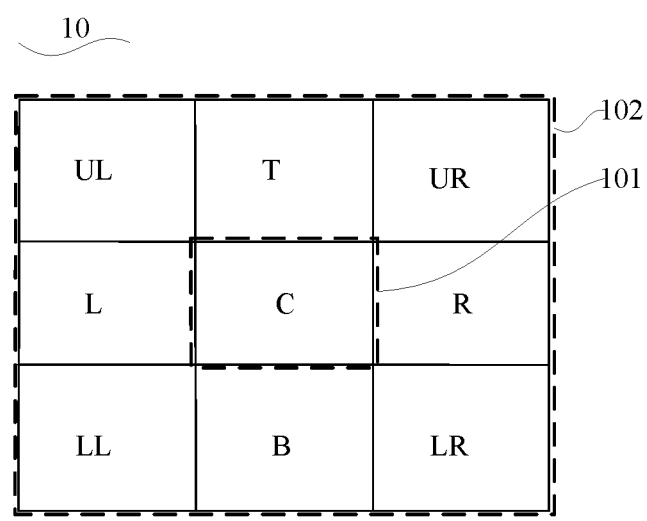

At S11, referring to S11 in FIG. 1 and FIG. 2, an initial layout 10 is provided.

In an example, the initial layout 10 includes a center layout 101 and a periphery layout 102. The periphery layout 102 surrounds the outer side of the center layout 101. Specifically, in the present embodiment, the initial layout 10 may be of a 9-unit structure, as illustrated in FIG. 2. The quantity of the center layout 101 is one, i.e., a layout C in FIG. 1. The periphery layout 102 may be 8 layouts, and may be respectively a layout UL located at the upper left of the center layout 101, a layout L located at the left of the center layout 101, a layout LL located at the lower left of the center layout 101, a layout B located at the bottom of the center layout 101, a layout T located at the top of the center layout 101, a layout UR located at the upper right of the center layout 101, a layout R located at the right of the center layout 101 and a layout LR located at the lower right of the center layout 101. Boundaries of the layout UL, the layout L, the layout LL, the layout B, the layout T, the layout UR, the layout R and the layout LR may be all rectangles.

Figure 3:
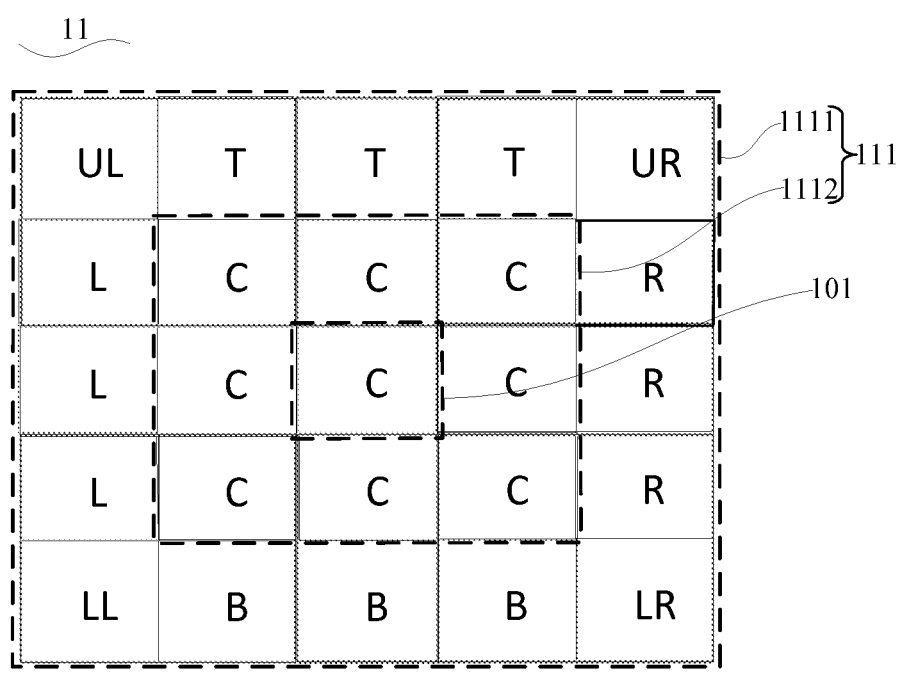

At S12, referring to S12 in FIG. 1 and FIGS. 3-4, the initial layout 10 is expanded to obtain an expanded layout 11.

In an example, the initial layout 10 is expanded based on a relationship between a dimension of the periphery layout 102 and an optical diameter.

In an example, as illustrated in FIG. 3, when a dimension of the periphery layout 102 is smaller than the optical diameter, two-dimensional expansion is performed on the center layout 101, and one-dimensional expansion is performed on the periphery layout 102 to obtain an expanded layout 11. The expanded layout 11 includes a center layout 101 and a periphery expanded layout 111. The periphery expanded layout 111 includes an expanded periphery layout 1111 and an expanded center layout 1112. A dimension of the periphery layout 102 may be understood as a minimum distance from an outer boundary of the periphery layout 102 to an outer boundary of the center layout 101. The Optical Dimeter (OD) is obtained according to the following empirical formula. The empirical formula of the optical diameter is as follows: $OD=20(\lambda/NA)/(1+\text{sigmamax})$. If sigmamax=1, NA=1.35, and $\lambda$=193 nm, OD is 1.43 um. For example, if the boundaries of the layout UL, the layout L, the layout LL, the layout B, the layout T, the layout UR, the layout R and the layout LR may be all rectangles, the initial layout 10 needs to be expanded to obtain the expanded layout 11 as long as a length or a width of a rectangular boundary of any one of the layout UL, the layout L, the layout LL, the layout B, the layout T, the layout UR, the layout R or the layout LR is smaller than the optical diameter. In the example, two-dimensional expansion is performed once on the center layout 101, and one-dimensional expansion is performed on the periphery layout 102 to obtain the expanded layout 11. That is, the expanded center layout 1112 in the expanded layout 11 includes eight layouts C which are obtained by expanding the center layout 101, the expanded periphery layout 1111 includes one layout UL, one layout UR, one layout LL, one layout LR, three layouts L, three layouts R, three layouts T and three layouts B. The expanded center layout 1112 and the expanded periphery layout 1111 form a new periphery layout, i.e., the periphery expanded layout 111.

Specifically, the expansion of the initial layout 10 is stopped when a dimension of the periphery expanded layout 111 in the expanded layout 11, as illustrated in FIG. 3, obtained through one time of expansion is greater than the optical diameter. If the dimension of the periphery expanded layout 111 in the expanded layout 11, as illustrated in FIG. 3, obtained through one time of expansion is smaller than the optical diameter, the obtained expanded layout 11 needs to be re-expanded until the dimension of the periphery expanded layout 111 in the obtained expanded layout 11 is greater than the optical diameter. A dimension of the periphery expanded layout 111 may be understood as a minimum distance from an outer boundary of the new periphery layout, which is formed by the expanded center layout 1112 and the expanded periphery layout 1111, to an outer boundary of the center layout 101.

In an example, the operation that the expanded layout 11 is re-expanded includes: two-dimensional expansion is performed on the center layout 101, and one-dimensional expansion is performed on the periphery expanded layout 111, and the number of expansion times is determined by the dimension of the periphery expanded layout 111 in the obtained expanded layout 11 and the size of the optical diameter. The expanded layout 11 obtained after the expansion is completed is as illustrated in FIG. 4.

Figure 5:
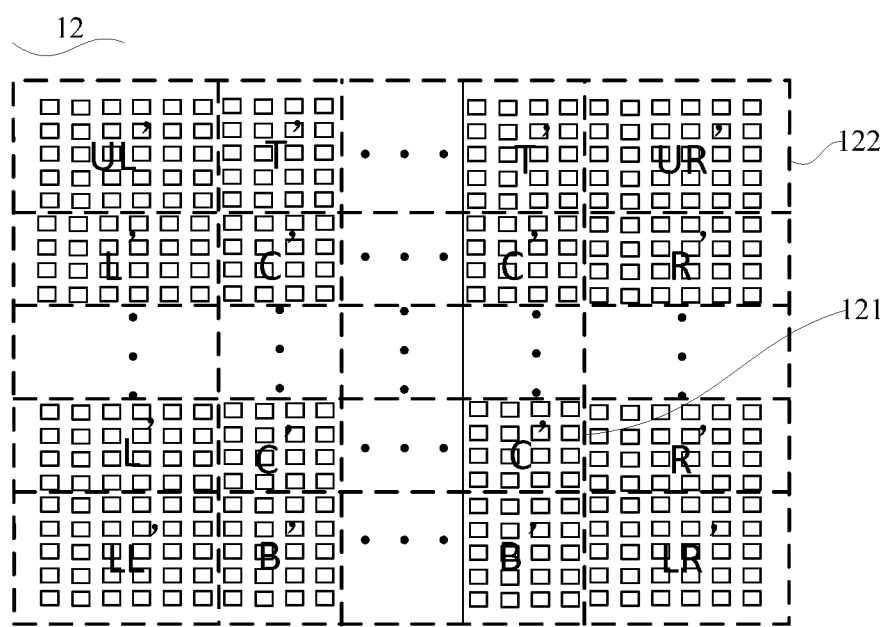
Figure 6:
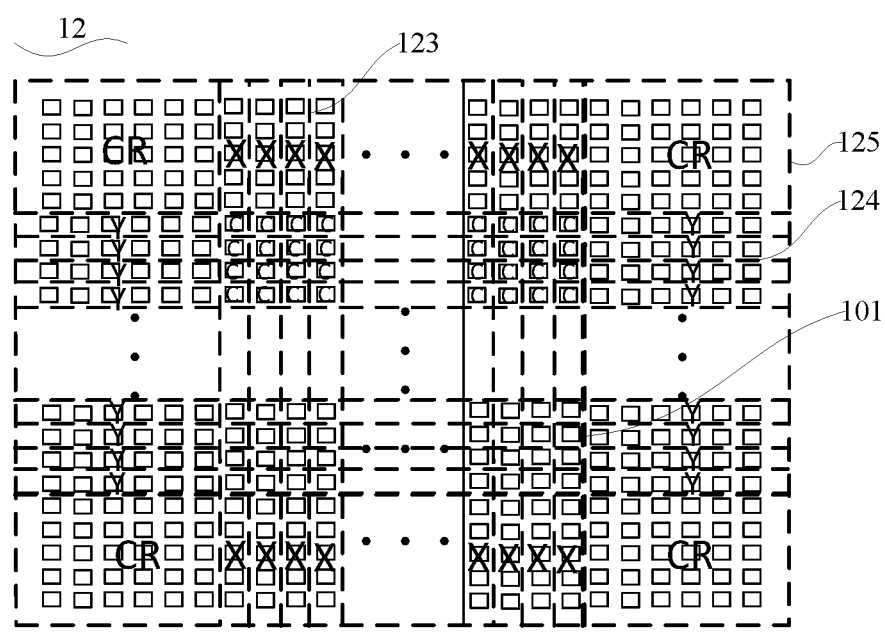
Figure 9:
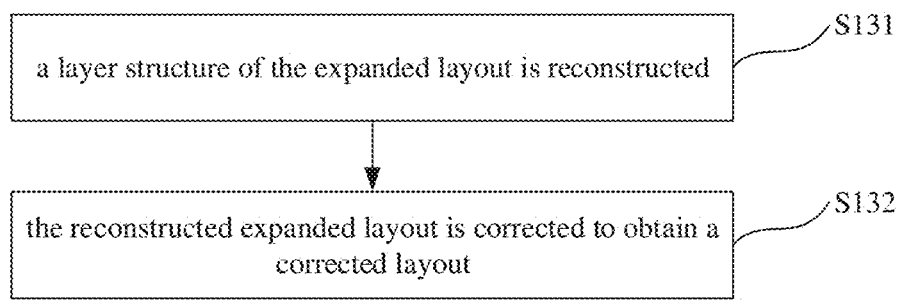
FIG. 9 illustrates a flowchart of a method for correcting an expanded layout by an embodiment of the present application.

At S13, referring to S13 in FIG. 1 and FIGS. 5-6 and referring to S131 and S132 in FIG. 9, the expanded layout 11 is corrected to obtain a corrected layout 12.

In an example, the operation at S13 may include the following operations.

At S131, a layer structure of the expanded layout 11 is reconstructed.

At S132, the reconstructed expanded layout 11 is corrected to obtain a corrected layout 12.

In an example, the operation at S131 may include the following operation.

The center layout 101 and the expanded center layout 1112 are reconstructed into a two-dimensional structure unit array 121. As illustrated in FIG. 5, the two-dimensional structure unit array 121 has a first direction and a second direction.

In an example, after the center layout 101 and the expanded center layout 1112 are reconstructed into the two-dimensional structure unit array 121, the operation at S131 further includes the following operation.

The part of the periphery expanded layout 111 is reconstructed into a two-dimensional structure unit array 122, as illustrated in FIG. 5. For example, the two-dimensional structure unit array 122 may be an active area array in a Dynamic Random Access Memory (DRAM) storage unit array area.

It should be noted that in FIG. 5, squares in each of the two-dimensional structure unit arrays are the expanded periphery layout 1111 or the expanded center layout 1112 before reconstruction.

Specifically, the first direction may be a direction from a two-dimensional structure array unit L' to a two-dimensional structure array unit R' in FIG. 5, and the second direction may be a direction from a two-dimensional structure array unit T' to a two-dimensional structure array unit B' in FIG. 5.

In another example, after the center layout 101 and the expanded center layout 1112 are reconstructed into the two-dimensional structure unit array 121, the operation at S131 may further includes the following operation.

The periphery expanded layout 111 is reconstructed into a first one-dimensional unit array 123, a second one-dimensional unit array 124 and a connection layout 125. The connection layout 125 is positioned between the first one-dimensional unit array 123 and the second one-dimensional unit array 124, as illustrated in FIG. 6. The first one-dimensional unit array 123 in FIG. 6 is a plurality of units X distributed in the first direction between two-dimensional structure units CR, and the second one-dimensional unit array 124 is a plurality of units Y distributed in a second direction between the two-dimensional structure units CR. Specifically, a distance between the units X may be a space of one cycle of a basic unit in the first direction, and a distance between the units Y may be a space of one cycle of a basic unit in the second direction. For example, the basic unit may be a single active area in the DRAM storage array area.

In an example, the two-dimensional structure unit array 121 has a first length in the first direction and a second length in the second direction. The first one-dimensional unit array 123 has a first extension length in the first direction, and the first extension length is the same as the first length. The second one-dimensional unit array 124 has a second extension length in the second direction, and the second extension length is the same as the second length.

It should be noted that the first expansion direction of the first one-dimensional unit array 123 is a distribution direction of the plurality of units X, and the second expansion direction of the second one-dimensional unit array 124 is a distribution direction of the plurality of units Y.

At S132, the reconstructed expanded layout 11 may be corrected by adopting an inversion photoetching technology to obtain the corrected layout 12.

Figure 7:
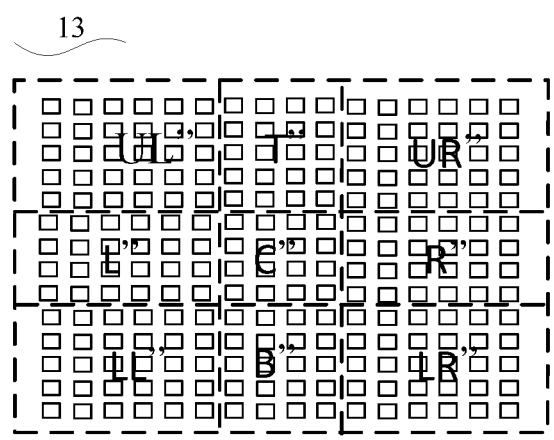

At S14, referring to S14 in FIG. 1 and FIGS. 7-8, the target layout 13 is obtained based on the corrected layout 12.

In an example, the operation at S14 may include the following operation.

The center layout 101 of the corrected layout 12, the connection layout 125, and part of the first one-dimensional unit array 123 and second one-dimensional unit array 124 corresponding to the center layout 101 are extracted, and are merged to form the target layout 13, as illustrated in FIG. 7.

Specifically, the obtained target layout 13 includes 9 two-dimensional structure unit arrays. That is, the target layout 13 includes a two-dimensional structure unit array UL", a two-dimensional structure unit array UR", a two-dimensional structure unit array LL", a two-dimensional structure unit array LR", a two-dimensional structure unit array L", a two-dimensional structure unit array C", a two-dimensional structure unit array R", a two-dimensional structure unit array T" and a two-dimensional structure unit array B" as illustrated in FIG. 7.

In another example, after the target layout 13 is formed after merging, the following operation may further be included.

The target layout 13 is expanded to obtain a complete layout 14. A diagram of the complete layout 14 as illustrated in FIG. 8. Specifically, two-dimensional expansion is performed on the two-dimensional structure unit array C" of the corrected target layout 13. One-dimensional expansion is performed on the two-dimensional structure unit array L", the two-dimensional structure unit array R", the two-dimensional structure unit array T" and the two-dimensional structure unit array B". The target layout may be expanded according to the practical dimension of the complete layout to directly obtain the corrected complete layout, and the correction precision of OPC of the corrected complete layout can be ensured. For example, the complete layout can be all layouts of the DRAM storage unit array area.

The technical features of the above embodiments can be combined arbitrarily. In order to make the description concise, all possible combinations of various technical features in the above embodiments are not completely described. However, as long as there is no contradiction in the combination of these technical features, it should be regarded as the scope of this specification.

The foregoing embodiments represent only a few implementations of the present application, and the descriptions are specific and detailed, but should not be construed as limiting the patent scope of the present application. It should be noted that those of ordinary skill in the art may further make variations and improvements without departing from the conception of the present application, and these all fall within the protection scope of the present application. Therefore, the patent protection scope of the present application should be subject to the appended claims.

The invention claimed is:

1. A layout correction method, comprising:
providing an initial layout comprising a center layout and a periphery layout, wherein the periphery layout surrounds an outer side of the center layout;
expanding the initial layout based on a relationship between a dimension of the periphery layout and an optical diameter to obtain an expanded layout;
correcting the expanded layout to obtain a corrected layout; and
obtaining a target layout based on the corrected layout;
wherein responsive to the dimension of the periphery layout being smaller than the optical diameter, two-dimensional expansion is performed on the center layout and one-dimensional expansion is performed on the periphery layout, to obtain the expanded layout; and
the expanded layout comprises the center layout and a periphery expanded layout, and the periphery expanded layout comprises an expanded periphery layout and an expanded center layout.

2. The layout correction method of claim 1, wherein the expansion of the initial layout is stopped responsive to a dimension of the periphery expanded layout being greater than the optical diameter.

3. The layout correction method of claim 1, further comprising:
re-expanding the expanded layout.

4. The layout correction method of claim 3, wherein re-expanding the expanded layout comprises:
performing the two-dimensional expansion on the center layout, and performing the one-dimensional expansion on the periphery expanded layout.

5. The layout correction method of claim 1, wherein correcting the expanded layout to obtain the corrected layout comprises:
reconstructing a layer structure of the expanded layout to obtain a reconstructed expanded layout; and
correcting the reconstructed expanded layout to obtain the corrected layout.

6. The layout correction method of claim 5, wherein reconstructing the layer structure of the expanded layout comprises:
reconstructing the center layout and the expanded center layout into a two-dimensional structure unit array, the two-dimensional structure unit array having a first direction and a second direction.

7. The layout correction method of claim 6, wherein reconstructing the layer structure of the expanded layout further comprises:
reconstructing part of the periphery expanded layout into a second two-dimensional structure unit array.

8. The layout correction method of claim 6, wherein reconstructing the layer structure of the expanded layout further comprises:
reconstructing the periphery expanded layout into a first one-dimensional unit array, a second one-dimensional unit array and a connection layout, the connection layout being positioned between the first one-dimensional unit array and the second one-dimensional unit array.

9. The layout correction method of claim 8, wherein the two-dimensional structure unit array has a first length in the first direction and a second length in the second direction;
the first one-dimensional unit array has a first extension length in the first direction, and the first extension length is same as the first length; and
the second one-dimensional unit array has a second extension length in the second direction, and the second extension length is same as the second length.

10. The layout correction method of claim 9, wherein obtaining the target layout based on the corrected layout comprises:
extracting a center layout of the corrected layout, the connection layout, and part of the first one-dimensional unit array and part of the second one-dimensional unit array which correspond to the center layout of the corrected layout, and performing merging to form the target layout.

11. The layout correction method of claim 10, further comprising:

expanding the target layout to obtain a complete layout.

* * * * *